(12) United States Patent
Sakamoto et al.

(10) Patent No.: US 10,811,609 B2
(45) Date of Patent: Oct. 20, 2020

(54) MANUFACTURING METHOD OF DISPLAY DEVICE

(71) Applicant: Sharp Kabushiki Kaisha, Sakai, Osaka (JP)

(72) Inventors: Mayuko Sakamoto, Sakai (JP); Tetsunori Tanaka, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/468,080

(22) PCT Filed: Sep. 6, 2017

(86) PCT No.: PCT/JP2017/032087
§ 371 (c)(1),
(2) Date: Jun. 10, 2019

(87) PCT Pub. No.: WO2019/049235
PCT Pub. Date: Mar. 14, 2019

(65) Prior Publication Data
US 2020/0168796 A1 May 28, 2020

(51) Int. Cl.
*H01L 21/00* (2006.01)
*H01L 51/00* (2006.01)
(Continued)

(52) U.S. Cl.
CPC ........ *H01L 51/003* (2013.01); *H01L 27/3244* (2013.01); *H01L 51/0097* (2013.01);
(Continued)

(58) Field of Classification Search
CPC ... H01L 51/003; H01L 27/3244; H01L 51/56; H01L 51/5253; H01L 51/0097;
(Continued)

(56) References Cited

U.S. PATENT DOCUMENTS 7,939,917 B2 * 5/2011 Lee ................. B32B 37/203
257/659
2009/0029525 A1 1/2009 Ohnuma
(Continued)

FOREIGN PATENT DOCUMENTS

JP 2009-010356 A 1/2009
JP 2009-049387 A 3/2009
(Continued)

OTHER PUBLICATIONS

Official Communication issued in International Patent Application No. PCT/JP2017/032087, dated Nov. 28, 2017.

*Primary Examiner* — Vu A Vu
(74) *Attorney, Agent, or Firm* — Keating & Bennett, LLP

(57) ABSTRACT

A manufacturing method of a display device includes a layering process including steps of forming a PI layer on a carrier glass substrate, forming a base coat layer to cover the PI layer, and forming a TFT layer and a light-emitting element layer on the base coat layer, an exposing process including a step of exposing an end surface of the PI layer, and a peeling process including a step of peeling the carrier glass substrate from the PI layer by irradiating the lower face of the PI layer with a laser light beam.

18 Claims, 9 Drawing Sheets

(51) Int. Cl.
*H01L 27/32* (2006.01)
*H01L 51/52* (2006.01)
*H01L 51/56* (2006.01)
*H01L 27/12* (2006.01)

(52) U.S. Cl.
CPC .......... *H01L 51/5253* (2013.01); *H01L 51/56* (2013.01); *H01L 27/1266* (2013.01); *H01L 2227/323* (2013.01); *H01L 2227/326* (2013.01); *H01L 2251/5338* (2013.01)

(58) Field of Classification Search
CPC ....... H01L 2227/326; H01L 2251/5338; H01L 27/1266; H01L 2227/323
USPC .......................................................... 438/23
See application file for complete search history.

(56) References Cited

U.S. PATENT DOCUMENTS

| | | |
|---|---|---|
| 2009/0114915 A1 | 5/2009 | Toriumi |
| 2015/0003024 A1 | 1/2015 | Huang et al. |
| 2015/0303408 A1 | 10/2015 | Lee et al. |
| 2016/0225670 A1* | 8/2016 | Itou .......... H01L 21/78 |
| 2017/0194605 A1* | 7/2017 | Kuji ...................... H01L 51/524 |
| 2017/0278878 A1 | 9/2017 | Kuwabara et al. |
| 2019/0363305 A1* | 11/2019 | Suga ...................... H05B 33/10 |

FOREIGN PATENT DOCUMENTS

| | | |
|---|---|---|
| JP | 2015-012289 A | 1/2015 |
| JP | 2015-233708 A | 12/2015 |
| JP | 2015-536555 A | 12/2015 |
| JP | 2017-183717 A | 10/2017 |
| JP | 2017-191283 A | 10/2017 |
| WO | 2016/046997 A1 | 3/2016 |

* cited by examiner

MANUFACTURING METHOD OF DISPLAY DEVICE

TECHNICAL FIELD

The disclosure relates to a manufacturing method of a display device including a peeling process of peeling a substrate from a polyimide (PI) layer by irradiating, with a laser light beam, the lower face of the PI layer in a layered body in which the PI layer, a base coat layer, a thin-film transistor (TFT) layer and a light-emitting element layer are layered on an optically transparent substrate. The disclosure also relates to a manufacturing apparatus for a display device including the peeling process.

BACKGROUND ART

A configuration is known in which, to peel a glass film from a holding sheet on which the glass film is bonded, a cutting line extending through the glass film in the thickness direction is formed in the glass film (PTL 1).

CITATION LIST

Patent Literature

PTL 1: JP 2015-223708 A (published on Dec. 14, 2015)

SUMMARY

Technical Problem

In a manufacturing process of an electro luminescence (EL) device, a substrate is peeled from a PI layer by irradiating, with a laser light beam, the lower face of the PI layer in a layered body, in which the PI layer, a base coat layer, a TFT layer and a light-emitting element layer are layered on a carrier glass substrate, and a lower face film configured by polyethylene terephthalate (PET) or the like is attached on the lower face of the PI layer.

In a laser lift off (LLO) process in which the interface between the PI layer and the carrier glass substrate is irradiated with a laser light beam, when foreign matters and/or defects are present on the rear surface of the carrier glass substrate, the foreign matters and the like block the laser light beam, and a non-irradiation region that is not irradiated with the laser light beam is formed in the lower face of the PI layer. Then, in a delamination process of peeling the carrier glass substrate from the PI layer, the carrier glass substrate adhering on the PI layer is mechanically peeled in the non-irradiation region. As a result, breaking and the like is caused in the PI layer, and a crack and the like might be propagated to the layered body. Consequently, faults might be caused in the TFT element formed in the TFT layer and the organic light emitting diode (OLED) element formed in the light-emitting element layer, and such faults might affect the display of the display device.

An object of an aspect of the disclosure is to provide a manufacturing method of a display device and a manufacturing apparatus for a display device that can appropriately peel a substrate from a PI layer.

Solution to Problem

A manufacturing method of a display device of according to an aspect of the disclosure includes, layering layers including, forming a resin layer on a substrate, the substrate being optically transparent, forming a base coat layer to cover the resin layer, and forming a TFT layer and a light-emitting element layer in this order on the base coat layer, exposing an end surface of the resin layer, and peeling the substrate from the resin layer by irradiating, with a peeling laser light beam configured to peel the substrate from the resin layer, a lower face of the resin layer having the end surface exposed by the exposing.

Advantageous Effects of Disclosure

According to an aspect of the disclosure, a substrate can be appropriately peeled from a PI layer.

DESCRIPTION OF EMBODIMENTS

First Embodiment

Figure 1:
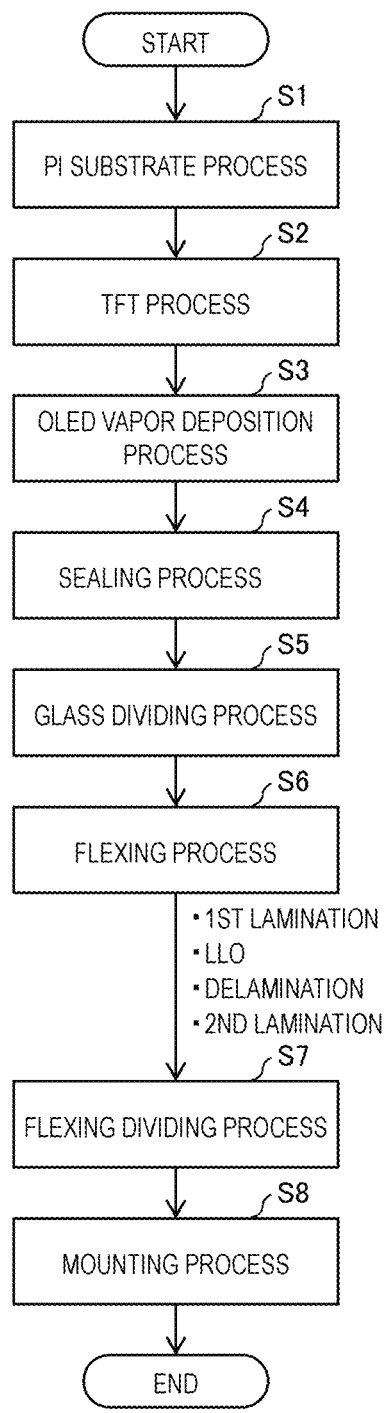
FIG. 1 is a flowchart of a manufacturing method of an EL device according to a first embodiment.
Figure 2A:
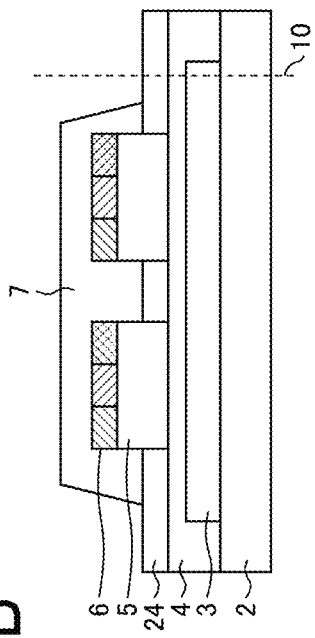
FIG. 2A is a cross-sectional view of an EL device on a carrier glass substrate for describing a glass cutting process of the manufacturing method of the EL device.
Figure 2B:
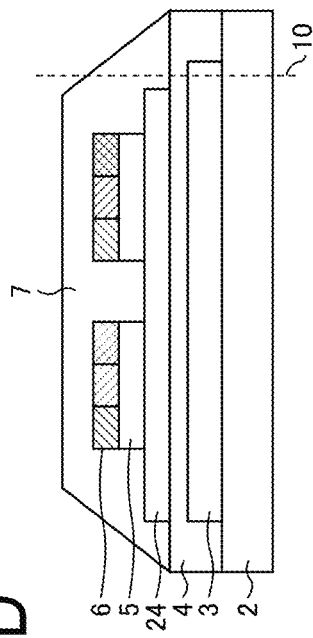
FIGS. 2B to 2D are cross-sectional views of modifications.
Figure 2C:
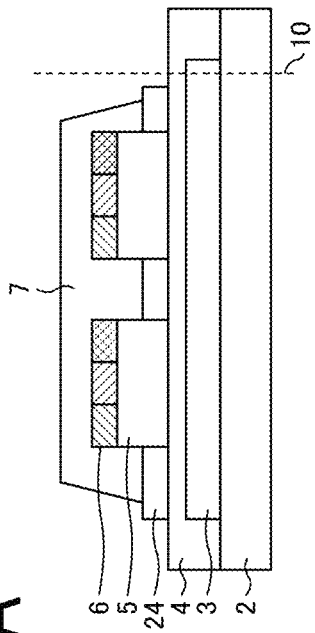
Figure 2D:
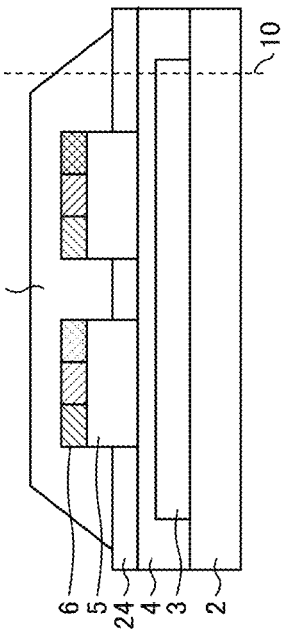
Figure 3:
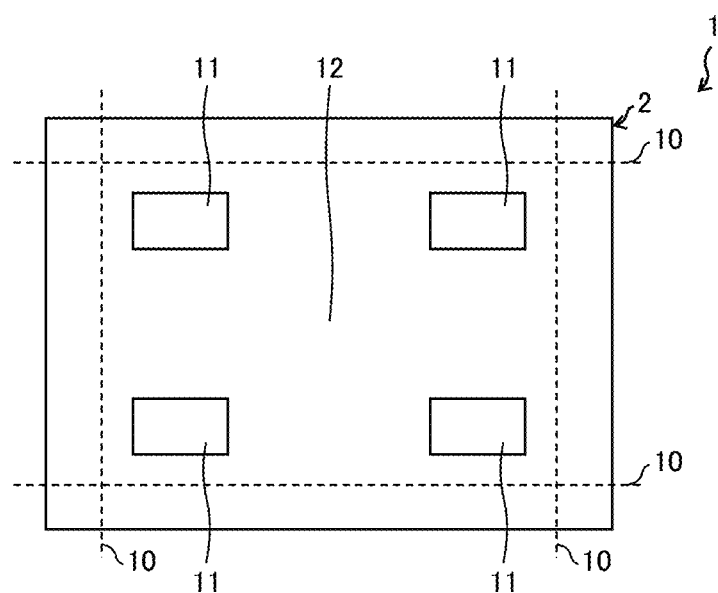
FIG. 3 is a plan view of the EL device on the carrier glass.

FIG. 1 is a flowchart of a manufacturing method of an EL device according to a first embodiment. FIG. 2A is a cross-sectional view of the EL device on a carrier glass substrate 2 for describing a glass cutting process in the manufacturing method of the EL device, and FIGS. 2B to 2D are cross-sectional views of modifications. FIG. 3 is a plan view of the EL device on the carrier glass substrate 2.

To manufacture an EL device, first, a PI layer 3 (resin layer) is formed on the carrier glass substrate 2 (substrate) having light transparency. Then, a base coat layer 4 is formed to cover the PI layer 3 (step S1).

Next, a TFT layer 5 is formed on the base coat layer 4, and an insulating film 24 adjoining the TFT layers 5 is formed (step S2). Thereafter, a light-emitting element layer 6 including an OLED element is formed on the TFT layer 5 by vapor deposition (step S3). Note that the light-emitting element layer 6 may include an inorganic light-emitting diode or a quantum dot light-emitting diode (QLED).

Then, for the purpose of preventing permeation of moisture and/or oxygen, a sealing layer 7 for sealing the TFT layer 5 and the light-emitting element layer 6 is formed on the insulating film 24 (step S4).

Note that the sealing layer 7 may be configured to cover the insulating film 24 to be in direct contact with the base coat layer 4. In a manufacturing process of an OLED panel, the sealing layer 7 is typically formed such that the thickness of the sealing layer 7 gradually decreases toward an edge of the carrier glass substrate 2 as illustrated in FIGS. 2A to 2D.

Next, as illustrated in FIG. 2A, the base coat layer 4, the PI layer 3, and the carrier glass substrate 2 are cut with a blade along four cutting surfaces 10 extending along the periphery of the carrier glass substrate 2 (step S5). As a result, the end surfaces of the carrier glass substrate 2, the PI layer 3, and the base coat layer 4 are exposed. Therefore, the moisture in the air permeates into the PI layer 3 through the end surface of the PI layer 3.

Thereafter, in a first lamination process, an upper face sheet 8 (FIG. 4A) is bonded on the sealing layer 7.

Note that the insulating film 24, the base coat layer 4, the PI layer 3, and the carrier glass substrate 2 may be configured to be cut as illustrated in FIG. 2B, or the sealing layer 7, the insulating film 24, the base coat layer 4, the PI layer 3, and the carrier glass substrate 2 may be configured to be cut as illustrated in FIG. 2C. Alternatively, the sealing layer 7, the base coat layer 4, the PI layer 3, and the carrier glass substrate 2 may be configured to be cut as illustrated in FIG. 2D.

Figure 4A:
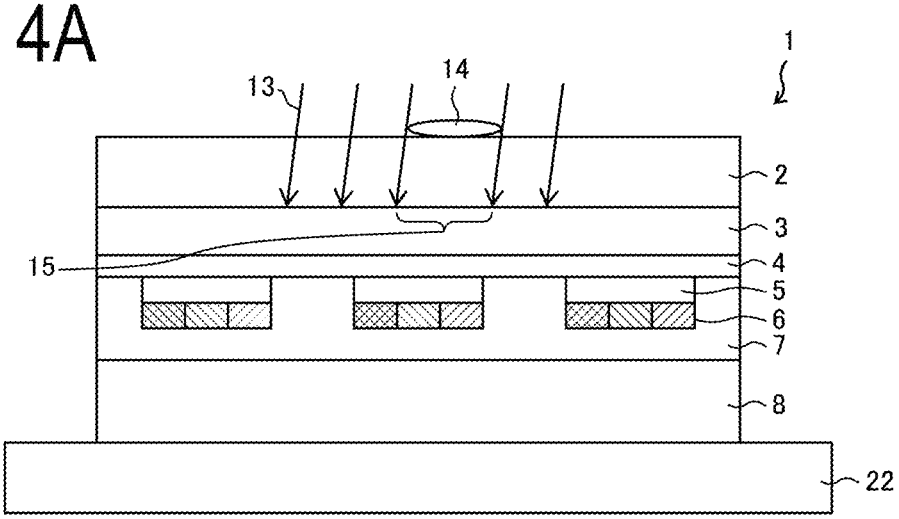
FIG. 4A is a schematic cross-sectional view of the EL device on the carrier glass substrate for describing an LLO process of manufacturing the EL device.
Figure 4B:
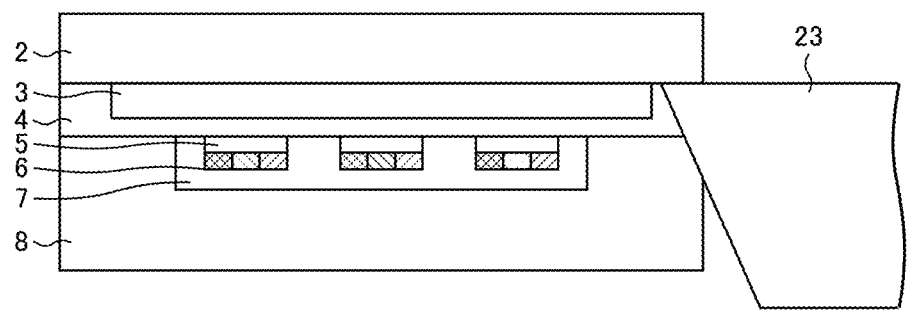
FIG. 4B is a schematic cross-sectional view of an EL device on a carrier glass substrate for describing an LLO process according to a comparative example.

FIG. 4A is a schematic cross-sectional view of the EL device on the carrier glass substrate 2 for describing an LLO process of manufacturing the EL device, and FIG. 4B is a schematic cross-sectional view of the EL device on the carrier glass substrate 2 for describing an LLO process according to a comparative example. Typically, in an actual manufacturing process of an OLED, a laser light beam 13 is irradiated from the upper side as illustrated in FIG. 4A. In addition, as illustrated in FIG. 4B, a method is known in which, in a delamination process, a blade 23 is inserted with the carrier glass substrate 2 facing the upper side (the carrier glass substrate 2 is sucked on a stage disposed above and not illustrated) such that the OLED panel falls by its own weight to a stage 22 disposed below.

Note that FIG. 4A is a simplified cross-sectional view. The actual cross-section includes a wiring line, a contact hole, and a planarization film layer, and thus the TFT layer 5 and the light-emitting element layer 6 have more complicated structures. The scales of the film thicknesses of the layers illustrated in FIG. 4A are different from the actual scales. The same applies to FIG. 4B.

In the LLO process, as illustrated in FIG. 4A, the stage 22 with a suction mechanism sucks the upper face sheet 8 bonded on the sealing layer 7. The interface between the PI layer 3 and the carrier glass substrate 2 is irradiated with the laser light beam 13 (peeling laser light beam). At this time, when a foreign matter 14 and/or defects are present in the rear surface of the carrier glass substrate 2, a part of the laser light beam 13 is blocked by the foreign matter 14. As a result, a non-irradiation region 15 that is not irradiated with the laser light beam 13 is formed in the lower face of the PI layer 3 at a position corresponding to the position of the foreign matter 14 present in the rear surface of the carrier glass substrate 2.

In a delamination process in the related art, the carrier glass substrate 2 is peeled from the PI layer 3 by inserting the blade 23 to the interface between the carrier glass substrate 2 and the PI layer 3 along the horizontal direction as illustrated in FIG. 4B. The base coat layer 4 is configured to cover the PI layer 3. While, in the LLO process, the carrier glass substrate 2 is peeled from the PI layer 3, the base coat layer 4 is adhering to the carrier glass substrate 2 in the region where the PI layer 3 is not present. In the delamination process in the related art, to completely peel the carrier glass substrate 2, including the above-mentioned region, the blade 23 is inserted to the interface between the upper face sheet 8 and the carrier glass substrate 2 in a sliding manner such that the blade 23 slides in the periphery.

Such a method in the related art raises the following concerns. First, the blade 23 cannot be appropriately inserted to the interface between the upper face sheet 8 and the carrier glass substrate 2, and the carrier glass substrate 2 cannot be peeled. Consequently, when the blade 23 is slid, a crack might be caused in either of the base coat layer 4, the TFT layer 5, the light-emitting element layer 6, and the sealing layer 7, and a display failure of the display device might result.

Figure 5A:
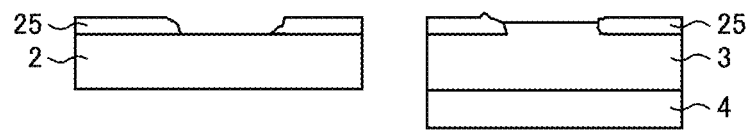
FIG. 5A is a cross-sectional view for describing a peeling state of the carrier glass substrate from the PI layer.
Figure 5B:
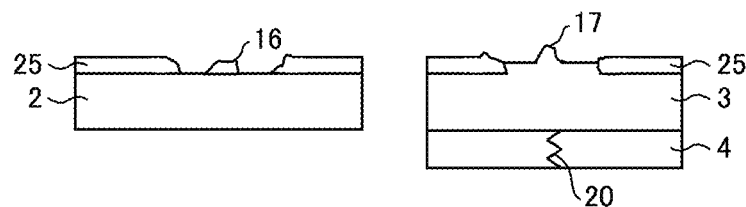
FIG. 5B is another cross-sectional view for describing a peeling state of the carrier glass substrate from the PI layer.
Figure 5C:
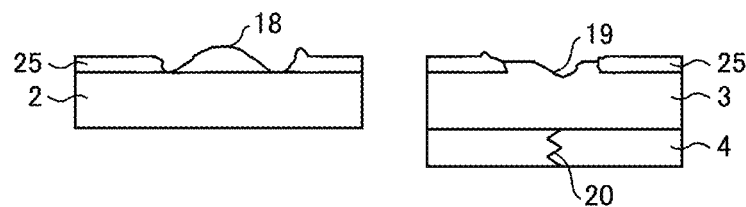
FIG. 5C is a still another cross-sectional view for describing a peeling state of the carrier glass substrate from the PI layer.

FIG. 5A is a cross-sectional view for describing a peeling state of the carrier glass substrate 2 from the PI layer 3, FIG. 5B is another cross-sectional view for describing a peeling state of the carrier glass substrate 2 from the PI layer 3, and FIG. 5C is a still another cross-sectional view for describing a peeling state of the carrier glass substrate 2 from the PI layer 3.

When the interface between the carrier glass substrate 2 and the PI layer 3 is irradiated with a laser light beam, a PI carbide 25 is produced between the carrier glass substrate 2 and the PI layer 3. The PI carbide 25 adheres on the surface of the PI layer 3 after the peeling, and also on the surface of the carrier glass substrate 2 after the peeling.

When the adhesion strength between the PI layer 3 and the carrier glass substrate 2 is small, the carrier glass substrate 2 is peeled from the PI layer 3 without breaking the PI layer 3 as illustrated in FIG. 5A. That is, when the adhesion strength between the PI layer 3 and the carrier glass substrate 2 is small, a stress generated at the PI layer 3 by the carrier glass substrate 2 pulling the PI layer 3 does not result in a breaking failure of the PI layer 3 or a failure due to propagation of a crack to the base coat layer 4 even in the case that a region that is not irradiated with the laser light beam is formed due to foreign matters and the like present in the rear surface of the carrier glass substrate 2.

However, in the case that the adhesion strength between the PI layer 3 and the carrier glass substrate 2 is an intermediate level, the PI layer 3 is pulled by the carrier glass substrate 2 and breaks when the carrier glass substrate 2 is peeled from the PI layer 3 as illustrated in FIG. 5B. Then, the carrier glass substrate 2 is separated from the PI layer 3 with a breaking portion 16 adhering on the carrier glass substrate 2. In the PI layer 3, a pulled portion 17 is formed in a protruding shape at a portion corresponding to the breaking portion 16. A crack 20 is formed in the base coat layer 4.

In addition, in the case that the adhesion strength between the PI layer 3 and the carrier glass substrate 2 is large, the carrier glass substrate 2 might be separated from the PI layer 3 with a breaking portion 18 adhering on the carrier glass substrate 2 as illustrated in FIG. 5C. In the PI layer 3, a dug portion 19 is formed in a recess shape at a portion corresponding to the breaking portion 18.

In contrast, in the present embodiment, the end surface of the PI layer 3 is exposed, and therefore the moisture in the air has permeated into the PI layer 3 through the end surface of the PI layer 3. Accordingly, the adhesion strength between the carrier glass substrate 2 and the PI layer 3 is reduced by the moisture having permeated into the PI layer 3. As a result, even in the case that a region that is not irradiated with the laser light beam is formed due to foreign matters and the like present in the rear surface of the carrier glass substrate 2, the carrier glass substrate 2 can be readily peeled from the PI layer 3 with the upper face sheet 8 being sucked, without using the blade 23 as illustrated in FIG. 4B.

As described above, in the present embodiment, the end surface of the PI layer 3 is exposed before the delamination process, and therefore the blade 23 is not required in peeling of the carrier glass substrate 2. Thus, the failure caused by the delamination process in the related art using the blade 23 can be avoided.

Next, in a second lamination process, a lower face film is bonded on the lower face of the PI layer 3 from which the carrier glass substrate 2 has been peeled (step S6).

Thereafter, a plurality of EL devices (display devices) are formed by dividing the carrier glass substrate 2 into a plurality of cell regions 11 disposed in a PI region 12 of the carrier glass substrate 2 (step S7). Then, electronic components required for each EL device are mounted (step S8).

Figure 6:
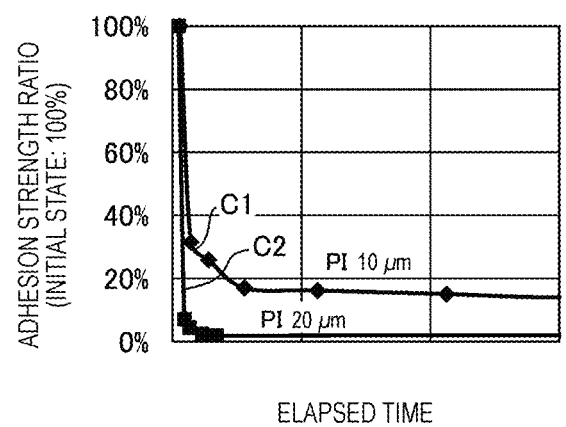
FIG. 6 is a graph illustrating a relationship between an elapsed time and a ratio of an adhesion strength between the carrier glass substrate and the PI layer.

FIG. 6 is a graph illustrating a relationship between an elapsed time and a ratio of the adhesion strength between the carrier glass substrate 2 and the PI layer 3. The abscissa axis indicates the elapsed time after the end surface of the PI layer 3 is exposed. The ordinate axis indicates the adhesion strength ratio with respect to 100% set as the initial adhesion force between the carrier glass substrate 2 and the PI layer 3. A curve C1 indicates variation of the adhesion strength in accordance with the elapsed time in the case that the PI layer 3 has a thickness of 10 μm. A curve C2 indicates variation of the adhesion strength in accordance with the elapsed time in the case that the PI layer 3 has a thickness of 20 μm.

As the curves C1 and C2 indicate in FIG. 6, the adhesion strength keeps decreasing within a certain period of time (e.g. approximately eight hours) after the end surface of the PI layer 3 is exposed. Thereafter, the adhesion strengths of the curves C1 and C2 become constant with respect to the elapsed time. Preferably, the LLO process of a flexing process (FIG. 1, step S6) is implemented after four hours or more, more preferably eight hours or more, have elapsed after the end surface of the PI layer 3 is exposed in a glass dividing process (FIG. 1, step S5).

The reduction in adhesion strength of the curve C2 with time is greater than the reduction in adhesion strength of the curve C1. That is, the larger the film thickness of the PI layer 3, the greater the reduction in adhesion strength with time. While the variation of the adhesion strength with time differs depending on the type of the PI layer 3, the relationship in which the greater the film thickness, the greater the reduction in adhesion strength holds true regardless of the type of the PI layer 3.

In view of this, with a configuration in which the film thickness of the PI layer 3 is greater at a portion corresponding to a cutting surface 10 than at a portion not corresponding to the cutting surface 10, the area of the end surface of the PI layer 3 is increased, and thus the moisture in the air is easily absorbed into the PI layer 3. As a result, the adhesion strength between the carrier glass substrate 2 and the PI layer 3 can be further reduced.

While the carrier glass substrate 2 and the like are cut with a blade in the above-described example, the disclosure is not limited to this. The carrier glass substrate 2 and the like may be cut with a laser light beam (exposing laser light beam). Note that it is preferable to perform the cutting with a blade from the view point of the relationship between the heat of the laser light beam and the ease of permeation of moisture into the end surface of the PI layer 3.

In the case that the sealing process (FIG. 1, step S4) and the preceding processes are performed in a first factory and the LLO process (FIG. 1, step S6) and the subsequent processes are performed in a second factory, which is located far away from the first factory, it is preferable to perform the glass dividing process according to the present embodiment in the first factory. The reason for this is that a sufficient time elapses during transportation of the carrier glass substrate 2 from the first factory to the second factory, and the moisture in the air sufficiently permeates in from the end surface of the PI layer 3 exposed in the first factory, thus sufficiently reducing the adhesion strength between the PI layer 3 and the carrier glass substrate 2.

While the carrier glass substrate 2, the PI layer 3, the base coat layer 4, and the sealing layer 7 are cut in the above-described example, the disclosure is not limited to this. It suffices to perform cutting to expose at least a part of the end surface of the PI layer 3. For example, it suffices to perform cutting from the sealing layer 7 to the PI layer 3 without cutting the carrier glass substrate 2.

Second Embodiment

Another embodiment of the disclosure is described below. For the sake of simplicity, members having the same functions as the members described in the foregoing embodiment will be given the same reference signs, and descriptions thereof will be omitted.

Figure 7:
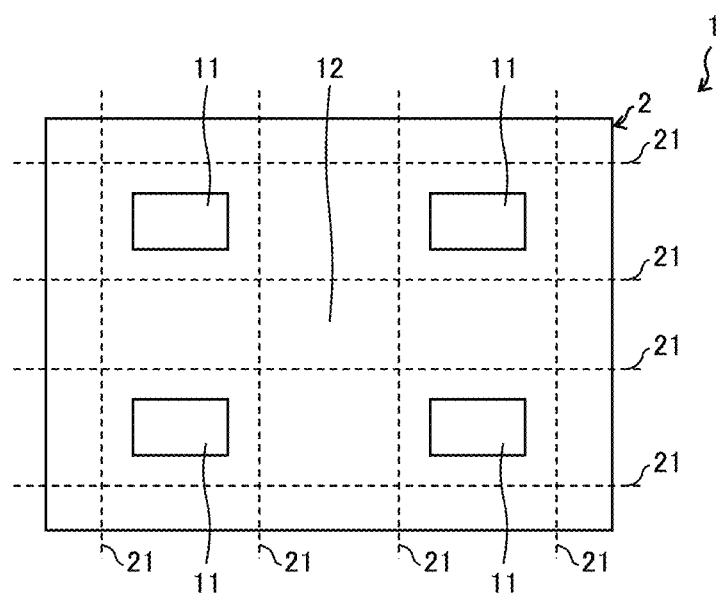
FIG. 7 is a plan view of an EL device on a carrier glass substrate according to a second embodiment.

FIG. 7 is a plan view of an EL device on the carrier glass substrate 2 according to the second embodiment. While the carrier glass substrate 2 and the like are cut along the four cutting surfaces 10 extending along the periphery of the carrier glass substrate 2 in the first embodiment, the disclosure is not limited to this. As illustrated in FIG. 7, the carrier glass substrate 2 and the like may be cut along a cutting surface 21 to be divided into a plurality of cell regions 11.

In this case, the first lamination process, the LLO process, the delamination process, and the second lamination process of step S6 in FIG. 1 are performed for each cell region 11. Then, since the dividing is already performed at step S5, implementation of step S7 is unnecessary.

Third Embodiment

Still another embodiment of the disclosure is described below. For the sake of simplicity, members having the same functions as the members described in the foregoing embodiment will be given the same reference signs, and descriptions thereof will be omitted.

Figure 8:
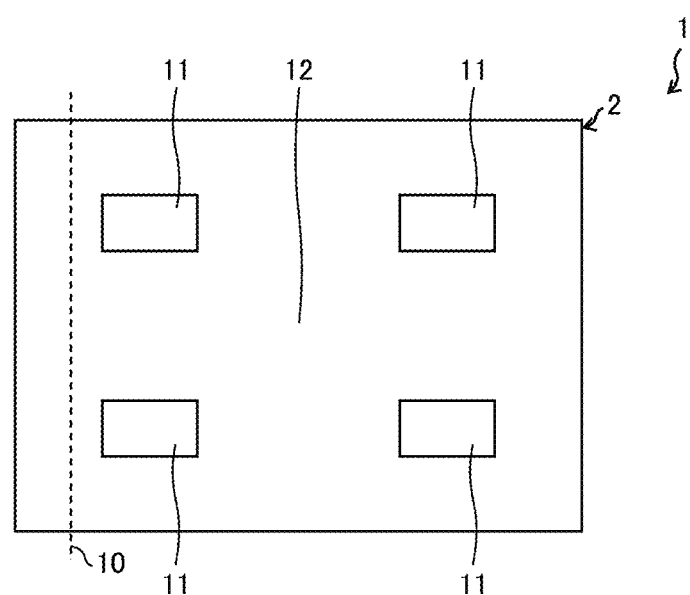
FIG. 8 is a plan view of an EL device on a carrier glass substrate according to a third embodiment.

FIG. 8 is a plan view of an EL device on the carrier glass substrate 2 according to a third embodiment. While the carrier glass substrate 2 and the like are cut along the four cutting surfaces 10 extending along the periphery of the carrier glass substrate 2 in the first embodiment, the disclosure is not limited to this. As illustrated in FIG. 8, the carrier glass substrate 2 and the like may be cut along the cutting surface 10 extending along one side of the carrier glass substrate 2. Preferably, the film thickness of the PI layer 3 is greater at portions extending along left and right sides of the carrier glass substrate 2 illustrated in FIG. 8 than at portions other than the portions extending along the left and right sides. The reason for this is that, since the area of the end surface of the PI layer 3 cut along the cutting surface 10 extending along one side of the carrier glass substrate 2 is increased, the moisture in the air is easily absorbed into the PI layer 3.

Fourth Embodiment

Still another embodiment of the disclosure is described below. For the sake of simplicity, members having the same functions as the members described in the foregoing embodiment will be given the same reference signs, and descriptions thereof will be omitted.

Figure 9A:
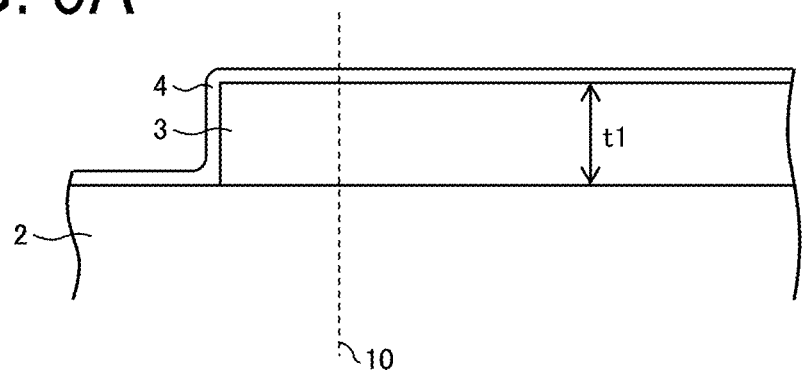
FIGS. 9A and 9B are cross-sectional views for describing a PI layer according to a fourth embodiment.

FIGS. 9A and B are cross-sectional views for describing a PI layer according to a fourth embodiment. As illustrated in FIG. 9A, the PI layer 3 and the base coat layer 4 may be formed such that the PI layer 3 is formed on the carrier glass substrate 2 and the base coat layer 4 is formed on the carrier glass substrate 2 so as to cover the PI layer 3. The PI layer 3 has a thickness t1 of 10 to 20 µm.

Figure 9B:
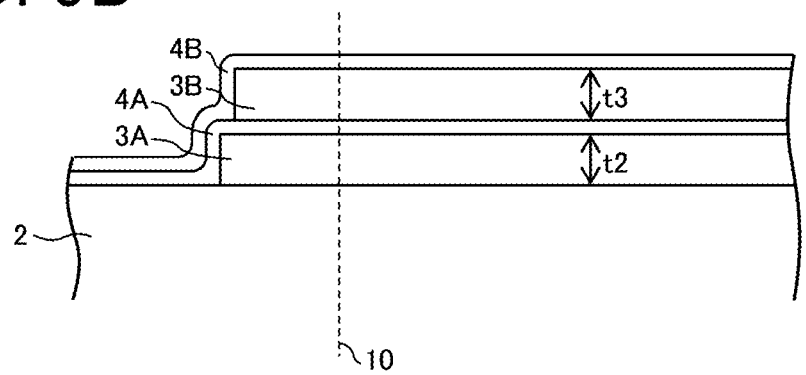

In addition, as illustrated in FIG. 9B, the layers may be formed such that the PI layer 3A (first resin part, resin layer) is formed on the carrier glass substrate 2, an intermediate inorganic film layer 4A is formed on the carrier glass substrate 2 to cover the PI layer 3A, the PI layer 3B (second resin part, resin layer) is further formed on the intermediate inorganic film layer 4A, the base coat layer 4B is formed on the intermediate inorganic film layer 4A to cover the PI layer 3B, and the base coat layer 4B, the PI layer 3B, the intermediate inorganic film layer 4A, the PI layer 3A, and the carrier glass substrate 2 are cut along the cutting surface 10. The PI layer 3A has a thickness t2 of approximately 6 µm, and the PI layer 3B has a thickness t3 of approximately 6 µm.

In this case, with the moisture in the air that permeates into the PI layer 3A through the exposed end surface of the PI layer 3A, the adhesion strength between the PI layer 3A and the carrier glass substrate 2 is reduced.

In addition, it is not necessary to cut all of the base coat layer 4B, the PI layer 3B, the intermediate inorganic film layer 4A, the PI layer 3A, and the carrier glass substrate 2, and it suffices that a part of the end surface of the PI layer 3A on the side it adheres on the carrier glass substrate 2 is exposed. That is, for example, at least a part of the PI layer 3A may be cut after the base coat layer 4B, the PI layer 3B, and the intermediate inorganic film layer 4A are cut.

Supplement

A manufacturing method of a display device of a first aspect includes, layering layers including, forming a resin layer on a substrate, the substrate being optically transparent, forming a base coat layer to cover the resin layer, and forming a TFT layer and a light-emitting element layer in this order on the base coat layer, exposing an end surface of the resin layer, and peeling the substrate from the resin layer by irradiating, with a peeling laser light beam configured to peel the substrate from the resin layer, a lower face of the resin layer having the end surface exposed by the exposing.

In a second aspect, the exposing includes cutting the resin layer with a blade to expose the end surface of the resin layer.

In a third aspect, the exposing includes irradiating the resin layer with an exposing laser light beam configured to expose the end surface of the resin layer.

In a fourth aspect, the exposing includes simultaneously cutting the resin layer and the substrate to expose the end surface of the resin layer.

In a fifth aspect, the layering includes forming the resin layer to have a film thickness of a portion corresponding to the end surface exposed by the exposing being greater than a film thickness of a portion not corresponding to the end surface.

In a sixth aspect, the layering includes forming the resin layer to have a film thickness of portions corresponding to a pair of sides of the substrate opposing to each other being greater than a film thickness of a portion other than the portions corresponding to the pair of sides, and the exposing includes exposing an end surface of the resin layer corresponding to one of the pair of sides.

In a seventh aspect, the exposing include exposing the end surface of the resin layer along a periphery of the substrate.

In the eighth aspect, the substrate includes a plurality of cell regions, and the exposing includes exposing the end surface of the resin layer along a periphery of each cell region.

In a ninth aspect, the layering includes sealing step forming a sealing layer for sealing the TFT layer and the light-emitting element layer, the method further includes laminating step bonding an upper face sheet on the sealing layer before the peeling, and the exposing is performed after the sealing and before the peeling.

In a tenth aspect, the peeling includes peeling the substrate from the resin layer while sucking the upper face sheet.

In an eleventh aspect, the peeling is performed after four hours or more have elapsed since the exposing was performed.

In a twelfth aspect, the blade cuts the base coat layer and the resin layer to a middle point of the resin layer without reaching the substrate.

In a thirteenth aspect, the resin layer includes a first resin part and a second resin part, the second resin part being disposed opposite the substrate with respect to the first resin part, and after cutting the base coat layer and the second resin part, the blade cuts the first resin part to a middle point of the first resin without reaching the substrate.

In a fourteenth aspect, the exposing includes exposing end surfaces of the base coat layer, the resin layer, and the substrate.

In a fifteenth aspect, the layering includes an insulation layer on the base coat layer, the insulation layer adjoining the TFT layer, and the exposing includes exposing end surfaces of the insulation layer, the base coat layer, the resin layer, and the substrate.

In a sixteenth aspect, the layering includes sealing step forming a sealing layer for sealing the TFT layer and the light-emitting element layer, and the exposing includes exposing end surfaces of the sealing layer, the insulation layer, the base coat layer, the resin layer, and the substrate.

In a seventeenth aspect, the layering includes sealing step forming a sealing layer for sealing the TFT layer and the light-emitting element layer, and the exposing includes exposing end surfaces of the sealing layer, the base coat layer, the resin layer, and the substrate.

A manufacturing apparatus for a display device of an eighteenth aspect includes, a layering mechanism configured to form a resin layer on a substrate, the substrate being optically transparent, to form a base coat layer to cover the resin layer, and to form a TFT layer and a light-emitting element layer in this order on the base coat layer, an exposure mechanism configured to expose an end surface of the resin layer, and a peeling mechanism configured to peel the substrate from the resin layer by irradiating, with a laser light beam configured to peel the substrate from the resin layer, a lower face of the resin layer being exposed an end surface by the exposure mechanism.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 EL device (display device)
2 Carrier glass substrate (substrate)
3 PI layer (resin layer)
3A PI layer (first resin part, resin layer)
3B PI layer (second resin part, resin layer)
4 Base coat layer
4A Intermediate inorganic film layer
4B Base coat layer
5 TFT layer
6 Light-emitting element layer
7 Sealing layer
8 Upper face sheet
10 Cutting surface
11 Cell region
12 PI region
13 Laser light beam
14 Foreign matter
15 Non-irradiation region
16 Breaking portion
17 Pulled portion
18 Breaking portion
19 Dug portion

The invention claimed is:

1. A manufacturing method of a display device, the method comprising:
    layering layers including, forming a resin layer on a substrate, the substrate being optically transparent, forming a base coat layer to cover the resin layer, and forming a TFT layer and a light-emitting element layer in this order on the base coat layer;
    exposing an end surface of the resin layer by simultaneously cutting the resin layer and the substrate before irradiating with a peeling laser light beam to peel the substrate from the resin layer; and
    peeling the substrate from the resin layer by irradiating, with the peeling laser light beam, a lower surface of the resin layer having the end surface exposed by the exposing,
    wherein the layering includes forming the resin layer to have a film thickness of a portion corresponding to the end surface exposed by the exposing being greater than a film thickness of a portion not corresponding to the end surface.

2. The manufacturing method of the display device according to claim 1, wherein the exposing includes cutting the resin layer with a blade to expose the end surface of the resin layer.

3. The manufacturing method of the display device according to claim 1, wherein the exposing includes irradiating the resin layer with an exposing laser light beam configured to expose the end surface of the resin layer.

4. The manufacturing method of the display device according to claim 1,
    wherein the exposing includes exposing the end surface of the resin layer along a periphery of the substrate.

5. The manufacturing method of the display device according to claim 1, wherein
    the substrate includes a plurality of cell regions, and
    the exposing includes exposing the end surface of the resin layer along a periphery of each cell region.

6. The manufacturing method of the display device according to claim 1, wherein
    the layering includes sealing step forming a sealing layer for sealing the TFT layer and the light-emitting element layer,
    the method further includes laminating step bonding an upper face sheet on the sealing layer before the peeling, and
    the exposing is performed after the sealing and before the peeling.

7. The manufacturing method of the display device according to claim 6, wherein the peeling includes peeling the substrate from the resin layer while sucking the upper face sheet.

8. The manufacturing method of the display device according to claim 1, wherein the peeling is performed after four hours or more have elapsed since the exposing was performed.

9. The manufacturing method of the display device according to claim 2, wherein the blade cuts the base coat layer and the resin layer to a middle point of the resin layer without reaching the substrate.

10. The manufacturing method of the display device according to claim 2, wherein
    the resin layer includes a first resin part and a second resin part, the second resin part being disposed opposite the substrate with respect to the first resin part, and
    after cutting the base coat layer and the second resin part, the blade cuts the first resin part to a middle point of the first resin without reaching the substrate.

11. The manufacturing method of the display device according to claim 1, wherein the exposing includes exposing end surfaces of the base coat layer, the resin layer, and the substrate.

12. The manufacturing method of the display device according to claim 1, wherein
    the layering includes forming an insulation layer on the base coat layer, the insulation layer adjoining the TFT layer, and
    the exposing includes exposing end surfaces of the insulation layer, the base coat layer, the resin layer, and the substrate.

13. The manufacturing method of the display device according to claim 12, wherein
    the layering includes sealing step forming a sealing layer for sealing the TFT layer and the light-emitting element layer, and
    the exposing includes exposing end surfaces of the sealing layer, the insulation layer, the base coat layer, the resin layer, and the substrate.

14. The manufacturing method of the display device according to claim 1, wherein
    the layering includes sealing step forming a sealing layer for sealing the TFT layer and the light-emitting element layer, and
    the exposing includes exposing end surfaces of the sealing layer, the base coat layer, the resin layer, and the substrate.

15. A manufacturing method of a display device, the method comprising:
    layering layers including, forming a resin layer on a substrate, the substrate being optically transparent, forming a base coat layer to cover the resin layer, and forming a TFT layer and a light-emitting element layer in this order on the base coat layer;

exposing an end surface of the resin layer by simultaneously cutting the resin layer and the substrate before irradiating with a peeling laser light beam to peel the substrate from the resin layer; and peeling the substrate from the resin layer by irradiating, with the peeling laser light beam, a lower surface of the resin layer having the end surface exposed by the exposing, wherein the layering includes forming the resin layer to have a film thickness of portions corresponding to a pair of sides of the substrate opposing to each other being greater than a film thickness of a portion other than the portions corresponding to the pair of sides, and the exposing includes exposing the end surface of the resin layer corresponding to one of the pair of sides.

16. The manufacturing method of the display device according to claim 15, wherein the exposing includes cutting the resin layer with a blade to expose the end surface of the resin layer.

17. The manufacturing method of the display device according to claim 15, wherein the exposing includes irradiating the resin layer with an exposing laser light beam configured to expose the end surface of the resin layer.

18. The manufacturing method of the display device according to claim 15, wherein the peeling is performed after four hours or more have elapsed since the exposing was performed.

* * * * *